(12) United States Patent
Garrett

(10) Patent No.: US 7,760,479 B2
(45) Date of Patent: Jul. 20, 2010

(54) TECHNIQUE FOR COMBINING IN-RUSH CURRENT LIMITING AND SHORT CIRCUIT CURRENT LIMITING

(75) Inventor: James Garrett, Nashua, NH (US)

(73) Assignee: Fairchild Semiconductor Corporation, South Portland, ME (US)

( * ) Notice: Subject to any disclaimer, the term of this patent is extended or adjusted under 35 U.S.C. 154(b) by 1 day.

(21) Appl. No.: 12/132,286

(22) Filed: Jun. 3, 2008

(65) Prior Publication Data

US 2009/0257162 A1    Oct. 15, 2009

Related U.S. Application Data

(60) Provisional application No. 61/043,515, filed on Apr. 9, 2008.

(51) Int. Cl.
  *H02H 9/08* (2006.01)
  *H02H 3/00* (2006.01)
  *H02H 3/08* (2006.01)
  *H02H 9/02* (2006.01)
  *H02H 3/20* (2006.01)
  *H02H 9/04* (2006.01)

(52) U.S. Cl. .................. 361/93.9; 361/78; 361/79; 361/91.1; 361/93.1

(58) Field of Classification Search ............. 361/93.9
  See application file for complete search history.

(56) References Cited

U.S. PATENT DOCUMENTS

| 5,030,844 | A  | * | 7/1991 | Li et al. ............... 307/135 |
| 5,541,799 | A  | * | 7/1996 | Schmidt et al. ........... 361/18 |
| 6,215,338 | B1 | * | 4/2001 | Gervasi et al. ........... 327/108 |
| 6,396,311 | B2 | * | 5/2002 | Inn ......................... 327/70 |
| 7,035,071 | B1 | * | 4/2006 | Tiew et al. .............. 361/93.9 |
| 7,254,734 | B2 | * | 8/2007 | Lehr et al. ............... 713/340 |
| 7,268,992 | B2 | * | 9/2007 | Hallak et al. ........... 361/93.7 |
| 7,394,223 | B2 | * | 7/2008 | Lai et al. .................. 320/134 |
| 7,495,499 | B2 | * | 2/2009 | Chung et al. ............. 327/427 |
| 2003/0169025 | A1 | | 9/2003 | Finney |
| 2005/0072987 | A1 | | 4/2005 | Robb et al. |

OTHER PUBLICATIONS

"Notification of Transmittal of the International Search Report and the Written Opinion of the International Searching Authority, or the Declaration", International Application No. PCT/US2009/002144, mailed on Jul. 27, 2009, 12 pages.

* cited by examiner

*Primary Examiner*—Jared J Fureman
*Assistant Examiner*—Dharti H Patel
(74) *Attorney, Agent, or Firm*—Cesari and McKenna, LLP; Edwin H. Paul, Esq.

(57) ABSTRACT

A circuit that protects from high power-on in-rush currents and short circuits. The circuit has a pass transistor and a parallel smaller transistor. A comparator senses when an output voltage crosses a reference and turns off the pass transistor and turns on the parallel smaller transistor. The parallel smaller transistor has a higher "on" resistance so that the short circuit or the in-rush current does not harm the electronics. When the short circuit or in-rush current condition is removed, the comparator senses this condition and returns to the normal operation where the pass transistor is on and the parallel small transistor is off.

9 Claims, 1 Drawing Sheet ical Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

TECHNIQUE FOR COMBINING IN-RUSH CURRENT LIMITING AND SHORT CIRCUIT CURRENT LIMITING

RELATED APPLICATIONS

The present application is related to and claims the benefit of the filing date of a provisional application, Serial No. 61/043,515, filed Apr. 9, 2008, and of common title, inventorship and ownership with the present application. The provisional application is incorporated herein by reference.

This application is also related to another application, entitled "Hot Swap Controller with Zero Loaded Charge Pump," filed on Jun. 6, 2008 and assigned Ser. No. 12/132,267, which is of common inventorship and ownership as the present application, and which application is incorporated herein by reference.

BACKGROUND OF THE INVENTION

1. Field of the Invention

The present invention relates to protecting circuits from excessive in-rush (initial power-on) current and short circuits during a "hot swap" or when a short circuit is placed on a circuit output, and, more particularly, for providing such protection with few components and an efficient use of die area. "Hot swap" refers to inserting and removing a circuit into or out of a computer system, without removing or powering down the system. Short circuit protection ensures that the circuit will survive when a short, or zero ohms, is placed directly on the output to ground.

2. Background Information

In the past, power was disconnected while plugging and unplugging circuits into computer or other such electronic systems. This was necessary since the random making and breaking of contacts as a circuit board or module was being inserted or removed from a connector could harm the circuits and/or the system. The possible mis-connections to power, ground and signal inputs and outputs were not controlled. Shorting the output of a circuit may also inadvertently occur and be destructive.

However, the need to disconnect and later re-connect power is onerous, especially where entire systems may have to be powered down, possibly in set sequences, and later powering up, possibly in set sequences, and re-establishing conditions may take too much time. Moreover, any errors while powering down or up could create high currents and power glitches that may harm the circuits.

Power-on in-rush current limiting (protection) and short circuit protection may use the same criteria, but those skilled in the art may use different criteria.

Today, it is common to plug and unplug and plug circuits, memories, controllers, etc., into electronic systems without removing power. However, these hot swapping, short circuit protective circuits take up valuable die space in such systems and often must be located externally with respect to the system they are protecting.

SUMMARY OF THE INVENTION

The present invention provides pass transistor that connects an input voltage, Vin, to an output voltage, Vout, that supplies a current, Iout, to a load (not shown). The invention provides both a programmable or settable current limit and short circuit protection with few components that efficiently use die area.

Illustratively, a small transistor is placed in parallel (excepting the control contact) with a pass transistor, typically the transistors are FETs, but other types may be used by those skilled in the art. Illustratively using FETs, both drains are joined and connected to Vin, and their sources connected to Vout. The pass FET is designed with a low RDSon ("on" resistance) while the small FET is designed with an RDSon that will sustain a short circuit at the output without harming the inventive circuit or the system producing Vin.

Note that the term "connect" is defined broadly herein to include additional components that may be in series or parallel with the "connection" but which do not interfere with the functions as described.

Illustratively, a comparator is used with one input connected to Vout and the other input to a reference voltage that may be set by a controller (not shown). When a short circuit occurs at the output, the comparator turns off the pass FET while turning on the small FET. As mentioned above, the small FET may be designed to withstand the short by presenting an RDSon resistance (or impedance) that does not harm the system that produces the Vin or the small FET.

The reference input to the comparator defines a voltage level, that, if the Vout is lowered by a high Iout below the reference voltage level, the comparator will trigger. This action, as with the short circuit, will turn off the pass FET and turn on the small FET. Again, the system producing Vin and the inventive circuit are protected.

Note, in both the short circuit and the high Iout in-rush protective conditions, when the conditions are relieved, Vout will return to a level higher than the reference voltage and the pass FET will turn on and the small FET will turn off.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
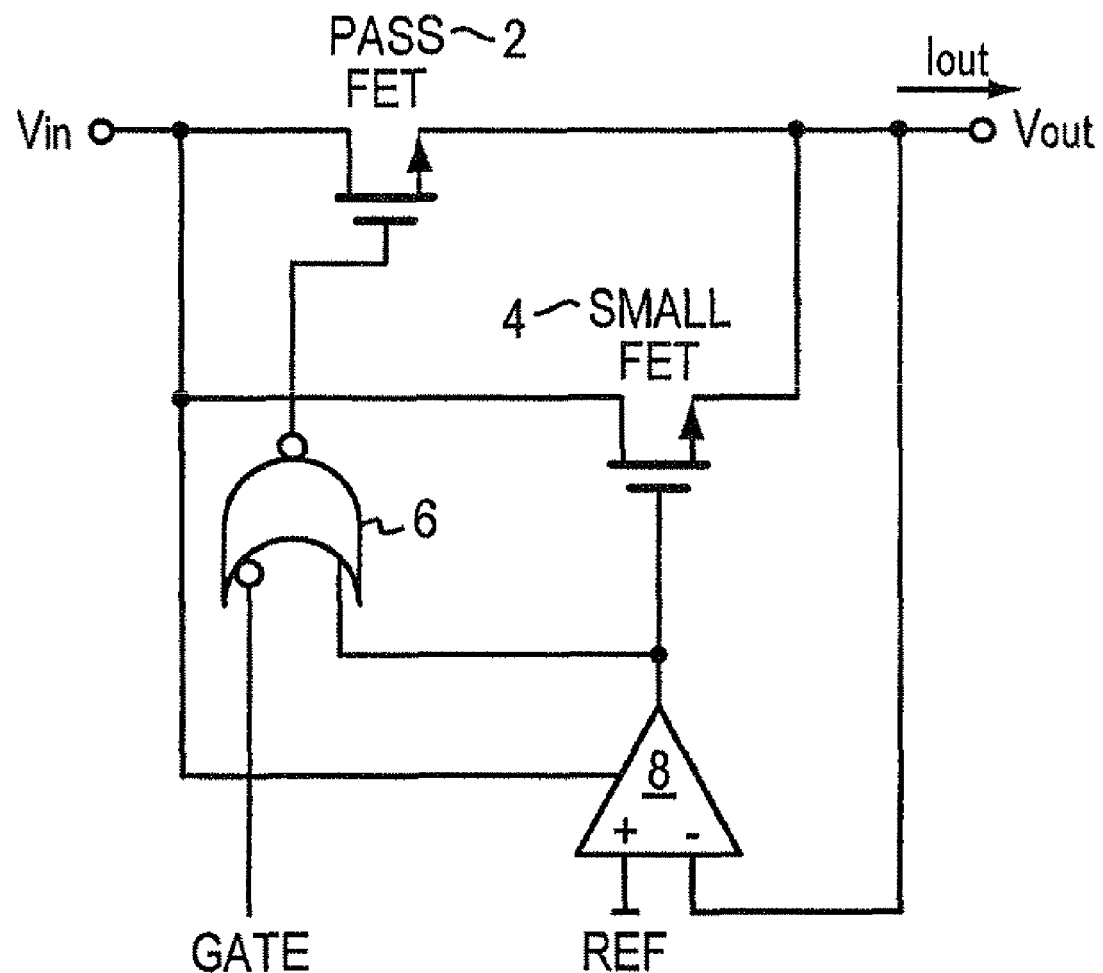
FIG. 1 is a schematic block diagram embodying the invention.

FIG. 1 illustrates one embodiment of the invention. Here a pass FET 2 is placed between Vin and Vout, and a small FET 4 is placed in parallel to the pass FET. The pass and the small share common drain and source connections, but the gates are separate. In this embodiment the transistors are NMOS types, but other types and polarities may be used in some applications.

For short circuit protection, the comparator 8 senses the Vout versus a reference voltage, REF. When a short circuit occurs at the load, Vout goes to about zero voltage, well below REF. The comparator output goes high turning on the small FET 4 that limits the short circuit current to a non-destructive level due to the high RDSon (the "on" resistance) of the small FET 4. The size of the small FET determines its RDSon, and it can be designed high enough to limit the current supplied to a short circuit. At the same time, the high output of the comparator also drives an input to the logic gate 6. The high level on the input of logic gate 6 drives the gate of the pass FET2 low, turning off the pass FET 2.

For a power-on in-rush current, similar operation occurs. Initially, Vout is at or near zero volts. When power is turned on, the reference voltage, Ref, will rise faster than Vin, since it is usually lightly loaded. In this state the small FET 4 will be biased on as Vin rises by the high comparator output that also biases the pass FET 2 off via the logic gate 6. As Vout rises (slowly as the load capacitance—not shown, is charges) it will reach and pass the Ref voltage. The small FET is turned off and the pass FET on, wherein the Vin charges the load capacitor to the Vin voltage. The power-on in-rush current is limited.

After the initial power-on of the circuits, the present invention detects and protects against short circuits. If a short is detected, illustratively, the small FET is turned on the pass turned off. When the short is removed, the power-on in-rush operation described above operates again.

If a separate detection level is desired distinguishing the in-rush detection level from the short circuit protection level, another comparator with another reference voltage may be used and logically "ORed" with the small FET gate drive.

During normal operation after power is applied and with no short circuit, the small FET is off, the pass FET on, and the inventive circuit acts as a standard hot swap controller. In this condition, in FIG. 1, the output of the comparator is low, and if the GATE signal is high, the output of the logic gate 6 will be high driving the pass FET 2 on. In this condition, the output of the comparator will be able to turn the pass FET off when a short circuit is detected. The comparator output will go high turning off the pass FET 2 while turning on the small FET 4. Illustratively, the GATE signal acts as an enable signal that allows the comparator to control the pass FET The logic gate 6 is characterized by the logic equation, OUT=$\overline{A}$B, where A is the output of the comparator 8 and B is the GATE signal. "OUT" drives the gate of the pass FET 2, and when OUT is high the pass FET 2 is on. So the only condition where the pass FET 2 is on, is when the output (A) of the comparator 8 is low and the GATE signal (B) is high. Either signal B going low or A going high will turn off the pass FET 2.

Since the comparator is used in both the short and power-on in-rush currents, when either condition exists, the pass FET 2 is turned off and the small FET 4 is turned on. When the short is removed, Vout will rise above the REF and normal operation will resume. Normal being when the output of the comparator is low, the pass FET 2 is turned on and the small FET 4 is turned off (again assuming the GATE signal is high).

The circuit of FIG. 1 allows a controller (not shown) to set the REF voltage level to program this embodiment of the invention. In practice the setting may be changed as a designer may determine. In addition, the controller may drive the GATE signal low to turn off the pass FET 2.

The smaller FET may be only slightly smaller, say 60% of the size of the pass FET, but, typically, the smaller FET is about 1% of the size of the pass FET. For example, the RDSon of the pass may be about 0.1 ohm while that of the smaller FET may be about 10 ohms. The size determines the short circuit current and the level of sustaining power-on in-rush current delivered.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A circuit that limits current and protects against short circuits, the circuit comprising:
    a pass transistor defining a first input, a first output and a first control, wherein the input is connected to an input voltage, the first output delivers an output current to a load;
    a second transistor defining a second input, a second output and a second control, wherein the first and second inputs and outputs are connected together, and wherein the second transistor is smaller than the pass transistor;
    a programmable reference that sets the current limit;
    a comparator with one input connected to the first and second outputs, a second input connected to the programmable reference, and the comparator having a compare output that drives the second control;
    a logic gate comprising an input connected to the compare output, wherein the logic gate output drives the first control, and wherein when the first and second outputs are at a lower voltage than the programmable reference, the compare output turns on the second transistor and turns off the pass transistor, and wherein, when the first and second outputs rise above the programmable reference, the compare output turns off the second transistor and turns on the pass transistor.

2. The circuit of claim 1 wherein the logic gate defines at least a two input logic function, wherein one gate input is connected to the compare output and the second gate input is connected to a control signal, wherein the control signal enables the compare output to turn on the pass transistor.

3. The circuit of claim 1 wherein the pass and the second transistors are n-type FETs.

4. The circuit of claim 1 wherein the second transistor has an on resistance that is larger than the on resistance of the pass transistor.

5. The circuit of claim 1 wherein the programmable reference defines a value, wherein the value defines a specific output voltage, wherein, when the output voltage is lower than the specific output voltage, the circuit turns off the pass transistor and turns on the second transistor.

6. The circuit of claim 1 wherein, when a short circuit occurs at the load, the circuit turns off the pass transistor and turns on the second transistor, and wherein, when the short circuit is removed from the load, the pass transistor is turned on.

7. The circuit of claim 1 wherein, when the first and second outputs are at first lower voltage than the programmable reference, the compare output at first turns on the second transistor and turns off the pass transistor; but when the first and second outputs return to a value higher than the programmable reference, the compare output turns on the pass transistor and turns off the second transistor.

8. The circuit of claim 1 wherein the comparator is powered from the input voltage.

9. A process for protecting a system from excessive output currents, the process comprising the steps of:
    passing the output current through a pass transistor;
    programming a reference voltage;
    comparing the programmable reference voltage to an output voltage level that correlates to the excessive output current level; wherein when the output voltage level lowers past the programmable reference voltage level the pass transistor is turned off and a second transistor is turned on, and wherein, when the output voltage level rises past the programmable reference, the pass transistor is turned on and the second transistor is turned off.

* * * * *